United States Patent [19]
Voorman et al.

[11] Patent Number: 5,103,228
[45] Date of Patent: Apr. 7, 1992

[54] SIGMA-DELTA MODULATOR

[75] Inventors: Johannes O. Voorman; Cornelis M. Hart, both of Eindhoven, Netherlands

[73] Assignee: U.S. Philips Corporation, New York, N.Y.

[21] Appl. No.: 713,181

[22] Filed: Jun. 10, 1991

[30] Foreign Application Priority Data

Jun. 22, 1990 [NL] Netherlands ............... 9001441

[51] Int. Cl.⁵ .............................. H03M 3/02
[52] U.S. Cl. ............................. 341/143; 375/28
[58] Field of Search .............. 341/143, 126, 155; 375/25, 26, 27, 28, 29, 33, 34

[56] References Cited

U.S. PATENT DOCUMENTS

| | | | |
|---|---|---|---|
| 4,467,291 | 8/1984 | Roza | 332/11 D |
| 4,772,871 | 9/1988 | Suzuki et al. | 341/155 |
| 4,947,171 | 8/1990 | Pfeifer et al. | 341/143 |

Primary Examiner—A. D. Pellinen
Assistant Examiner—Brian K. Young
Attorney, Agent, or Firm—Bernard Franzblau

[57] ABSTRACT

1-Bit signma-delta modulator having a loop filter (5,6,8), a first negative feedback loop (13,7,8) and a second negative feedback loop (14,4,5,6,8). The filter sections 5 and 8 are passive filter elements and filter section 6 is a high-gain active filter element. A circuit of this type makes a very high clock rate possible in the decision switch 10.

4 Claims, 5 Drawing Sheets

SIGMA-DELTA MODULATOR

BACKGROUND OF THE INVENTION

1. Field of the Invention

The invention relates to a sigma-delta modulator for converting an input signal into a 1-bit digital output signal, comprising:

a low-pass filter constituted by a series connection of first, second and third sections having at least first order filter functions, each section having an input and having an output for producing respective first, second and third section signals;

quantization means for converting the third section signal into the 1-bit digital output signal and for producing first and second feedback signals in response to the digital output signal;

a first subtractor stage for producing a first difference signal from the second section signal and the first feedback signal and for applying the first difference signal to the input of the third filter section;

a second subtractor stage for producing a second difference signal from the input signal and the second feedback signal and for applying the second difference signal to the input of the first filter section;

coupling means for coupling the first section signal to the input of the second filter section.

2. Description of the Related Art

Such a sigma-delta modulator (SDM) is known from "A 16-bit Oversampling A-to-D Conversion Technology Using Triple-Integration Noise Shaping", IEEE Journal of Solid-State Circuits, Vol. SC-22, No. 6, December 1987, pp. 921-928. Sigma-delta modulation is a technique in which an analog signal is made into a digital signal having high resolution and low quantization noise with the aid of oversampling by quantization means having low resolution and high quantization noise. The digital signal is reconverted to an analog feedback signal by means of a digital-to-analog converter having the same low resolution and is subtracted in a subtracting stage from the analog input signal. The difference between the two signals is filtered in an analog loop filter and applied to the quantization means. The use of a sufficiently high loop gain for baseband frequencies of the analog signal produces a digital signal in which the quantization noise within the baseband is low at the expense of a higher quantization noise above this baseband. By means of digital filter techniques, however, noise above the baseband can be suppressed effectively, for example, by means of a decimating filter that converts the oversampled 1-bit digital signal into a multi-bit digital signal at the desired lower sampling rate.

Sigma-delta modulation to a 1-bit digital signal is advantageous in the simplicity of the quantization means. A simple decision circuit having an inherently good linearity will then be sufficient, while the associated digital-to-analog converter may be omitted. The attainable signal-to-noise ratio in the 1-bit digital signal is determined, for example, by the extent of oversampling and the order of the loop filter. A higher order loop filter is advantageous because it allows a lower oversampling rate while a specific signal-to-noise ratio in the baseband is maintained. The order of the loop filter is limited in practice by stability problems. In the prior art SDM in the aforementioned article, third-order loop filters are used comprising a cascade connection of three first-order high-gain active integrators.

With these third-order filters satisfactory results can be achieved when digitizing audio signals in which the signal-to-noise ratio is so high that a 16-bit resolution in the ultimate digital audio signal is attainable. This requires oversampling rates of several MHz.

For digitizing the video signals in the above manner, the prior art 1-bit modulators fail due to the much higher oversampling rate needed. For a digital video signal having 10-bit resolution, a 32-fold oversampling rate of 432 MHz will be necessary if a third order loop filter is utilized. At such high sampling rates, however, the customary implementations of third order loop filters comprising the so-called switched capacitor filters and also RC-active filters will fail, because such filters can no longer process these rates as a result of parasitic influences. The loop gain at the high oversampling rate (clock signal frequency) becomes unpredictable so that nothing will come of the intended third order filter characteristic.

SUMMARY OF THE INVENTION

It is an object of the invention to provide a 1-bit SDM which can also be used at very high oversampling rates.

According to the invention a sigma-delta modulator of the type mentioned in the preamble is therefore characterized in that the first and third filter sections, as regards the signal frequencies, are arranged as passive networks and in that the second filter section is arranged as an active filter stage.

This SDM has two negative feedback loops. The first loop feeds back the digital signal to the quantization means via the first subtractor stage and the passive third filter section. The second loop feeds back the digital signal to the quantization means via the second subtractor stage, the passive first filter section, the active second filter section, the first subtractor stage and the passive third filter section. The loop gain in the second loop is high for frequencies in the baseband of the input signal and determines the accuracy of digital approximation of the input signal. With the applied very high sampling rate, the spectrum of the feedback signal is very wide and extends to several times the sampling rate. These very high rates are suppressed in the passive first filter section and the remaining lower signal frequencies can be further amplified and conveyed to the third filter section by the active filter section without causing any problems.

The first loop comprising only the passive third filter section determines the behavior of the SDM at high frequencies. For these high frequencies no high loop gain but still a small phase shift is necessary to maintain system stabilization, which is only possible by implementing a passive filter section.

A further embodiment of a SDM according to the invention is characterized in that the quantization means comprise a first latch for measuring the third section signal during a first phase of a clock signal and for producing a first latched signal during a second phase of the clock signal, and a second latch for measuring the first latched signal during the first phase of the clock signal and for producing a second latched signal during the second phase of the clock signal, the first and second latched signals functioning as the first and second feedback signals, respectively.

The 1-bit quantization means decide whether the filtered signal is larger or smaller than a certain reference. An accurate digital signal needs a very sensitive decision switch having little signal crosstalk and a very large bandwidth in view of the very high oversampling rate at which the decision switch is clocked. By arranging the decision switch as two cascaded latches, a high sensitivity and low signal crosstalk is achieved which, however, at very high clock rates is attended with additional undesired phase shift. Therefore, according to the invention the latched signal of the second cascaded latch is only used as the second feedback signal for the second loop in which the undesired additional phase shift at very high frequencies does not play any role but in which, nevertheless, a high sensitivity and reliability at the low baseband frequencies is necessary. The latched signal of the first cascaded latch is only used as the first feedback signal for the first loop in which the still relatively low sensitivity of the first latch is of minor importance, because in this first loop a much smaller loop gain is necessary. This first feedback signal, however, has less phase shift at high frequencies so that the phase margin of the system is wider and the stability of the system is enhanced.

If so desired, the loop filter can be made steeper so that the signal-to-noise ratio increases and an even higher bit resolution is attainable.

Yet another embodiment of a SDM according to the invention is characterized in that the modulator further includes at least one mixer stage for replacing, during the first phase of the clock signal, the instantaneous value of one of the first and second latched signals with a fixed signal value that is independent of this instantaneous value.

By exchanging the first and/or second feedback signal during the first phase of the clock signal, preceding the latching phase, for a fixed signal value, the signal shape of the feedback signals is independent of the output signals of the latches during the first phase of the clock signal. During the first phase these output signals are determined by the amplitude of the input signal applied to the latch. Due to the finite gain and bandwidth of the latches, the output signals show a constantly changing variation of the signal shape that depends on the instantaneous value of the input signal applied to the latch. This causes undesired non-linear crosstalk of this input signal to the feedback loops and causes an undesired error in the digital output signal. This very error is reduced by the mixer stages.

BRIEF DESCRIPTION OF THE DRAWINGS

The invention will now be further explained with reference to the appended drawings in which.

DESCRIPTION OF THE PREFERRED EMBODIMENTS

Figure 1:
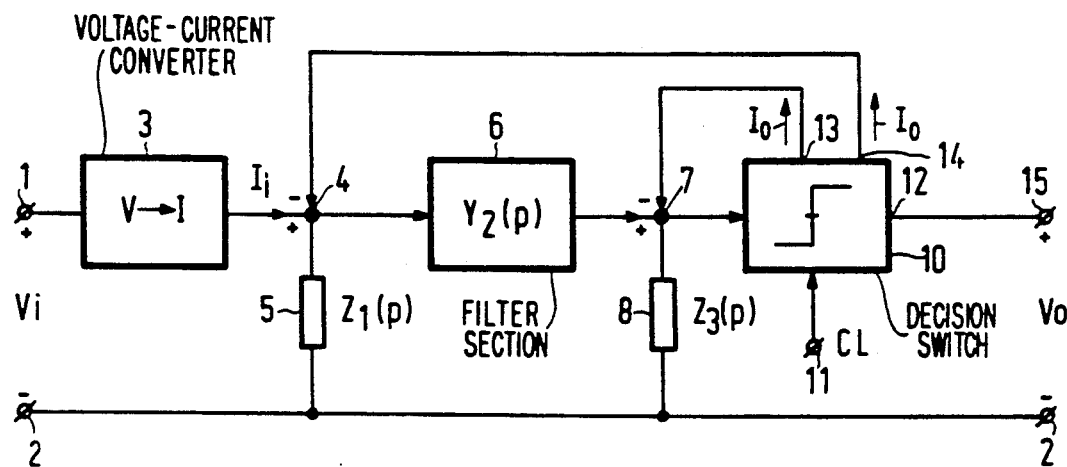
FIG. 1 shows a first block diagram of a sigma-delta modulator according to the invention.

FIG. 1 shows the block diagram of a 1-bit sigma-delta modulator (SDM) according to the invention. An input voltage Vi to be digitized is applied to input terminal 1 and common terminal 2 and converted by means of a voltage-to-current converter 3 into an input current Ii to be applied to a current summation point 4 which is connected to the common terminal 2 via a passive first-order impedance 5. The voltage-to-current converter 3 can be omitted if the input signal to be digitized is already available as a current. The passive first-order impedance 5 has a complex impedance $Z_1(p)$. The signal voltage across impedance 5 is connected to the input of an active first-order filter section 6 having complex admittance $Y_2(p)$. This section has a high gain and an a built-in voltage-to-current converter so that the output signal of filter section 6 is again available as a signal current. The output current of filter section 6 flows to a second current summation point 7 connected to the common terminal 2 via a passive first-order filter impedance 8 having a complex impedance $Z_3(p)$. The voltage across impedance 8 is connected to the input of a decision switch 10 in which a decision is made, under the control of a clock signal CL on control input 11, as to whether this voltage is larger or smaller than a specific reference. The result of this decision is available as a digital output signal at the outputs 12, 13 and 14 of the decision switch 10. Two of these digital output signals, that is to say, those at the outputs 13 and 14, function as first and second feedback signals and are available as a current Io and are fed back to the current summation points 7 and 4, respectively. The third digital output signal at output 12 of decision switch 10 is available as a voltage Vo on an output terminal 15, but may as well be realized as a current source.

While current summation points 4 and 7 are shown in the drawings, it should be apparent that these current summation points are actually subtraction stages for subtracting the feedback current from the input current $I_i$ and from the output signal of filter section 6, respectively.

Figure 2:
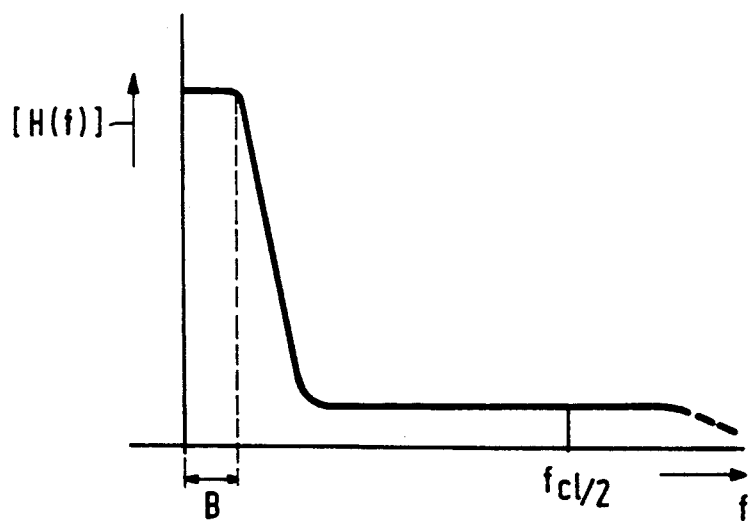
FIG. 2 shows a graph of the frequency characteristic of a third-order loop filter of a sigma-delta modulator.

The circuit acts as a SDM comprising a third-order loop filter around the decision switch 10. FIG. 2 shows in a diagrammatic manner the frequency characteristic of the loop filter. The loop gain for low frequencies situated in the baseband B of the input signal is large. The loop gain decreases with increasing frequency according to a slope determined by the order of the loop filter and subsequently becomes constant again around the clock rate fcl. The phenomenon of negative feedback achieves that the quantization noise in the digital output signal is small in the baseband B and increases for higher frequencies (noise shaping). Suppression of the quantization noise in the digital output signal is proportional to the loop gain in the baseband B. In order to achieve the optimum result, a high loop gain in the baseband B and a steep transfer to a lower gain for frequencies exceeding B are desired. In order to avoid stability problems in the feedback system, in practice the order of the loop filter determining the slope of the transfer are chosen to be no greater than three. Very high oversampling rates (clock rates) are necessary in a 1-bit SDM for video signals. A digital video signal having 10-bit resolution requires a clock rate fcl of, for example, 432 MHz when a third-order loop filter and 32-bit oversampling is used. At such high frequencies the conventional known third-order SDM's will no longer function. As published in, for example, "A 16-bit Oversampling A-to-D Conversion Technology Using Triple-Integration Noise Shaping" IEEE Journal of Solid-State Circuits, Vol. SC-22, No. 6, December 1987, pp. 921-928, the prior art third-order loop filters are constituted by a cascade connection of three active high-gain first-order integrators. Such active filters cannot cope with the very high rates involved in oversampling the video signals. This problem is solved by means of the SDM as shown in FIG. 1. The overall third-order transfer function H(P) of the loop filter is determined here by a cascade connection of a passive first-order filter section 5, an active first-order filter section 6 and a passive first order filter section 8 with a feedback of the digital output signal Io to the summing points 4 and 7. The general shape of the third order loop gain H(P) is:

$$H(p) = K \cdot \frac{(p - z_1)(p - z_2)(p - z_3)}{(p - p_1)(p - p_2)(p - p_3)} \quad 1$$

where K is a constant value, $z_i$ is the zeroes and $p_i$ the poles of H(p). This formula can be reduced to:

$$H(p) = \left( \frac{(a + bp)}{(p - p_1)(p - p_2)} + K \right) \cdot \frac{p - z_3}{p - p_3} \quad 2$$

The digital output signal passes through two loops in accordance with formula (2). The first loop comprises output 13 of the decision switch 10, summation point 7 and the passive first order impedance 8 which has a zero $z_3$ and a pole $p_3$. The second loop comprises output 14 of the decision switch 10, summation point 4, the passive first order impedance 5 with a pole $p_1$, the active first order admittance $Y_2(p)$ of section 6 with a pole $p_2$ and a suitably selected zero. This third order loop filter does function at very high clock rates because the active section 6 need not amplify the very high frequencies as they have been filtered out by the passive impedance 5 operating smoothly with these frequencies. The active filter section 6 now in essence needs to amplify the frequencies of the baseband B of the input signal. This is attainable with advanced video amplifier stages. The second loop thus contributes to the overall loop gain only for the low frequency range and determines by means of a high gain in the baseband the accuracy with which the digital output signal approaches the input signal. For a 10-bit resolution in the 1-bit oversampled signal the necessary baseband gain is approximately 60 to 70 dB more than at high frequencies. The first loop contributes to the overall loop gain for the entire frequency range of which, however, the area above the baseband is most important. For this matter, due to the relatively low loop gain for the baseband B in the first loop with respect to the second loop, only the higher frequencies above the baseband play a role in the first loop. The first loop comprises the decision switch 10 and the passive impedance 8 and is suitable for very high frequencies due to the simplicity of the loop components so that parasitic phase shift can be avoided. Therefore the feedback system remains stable even with very high frequencies.

Figure 3:
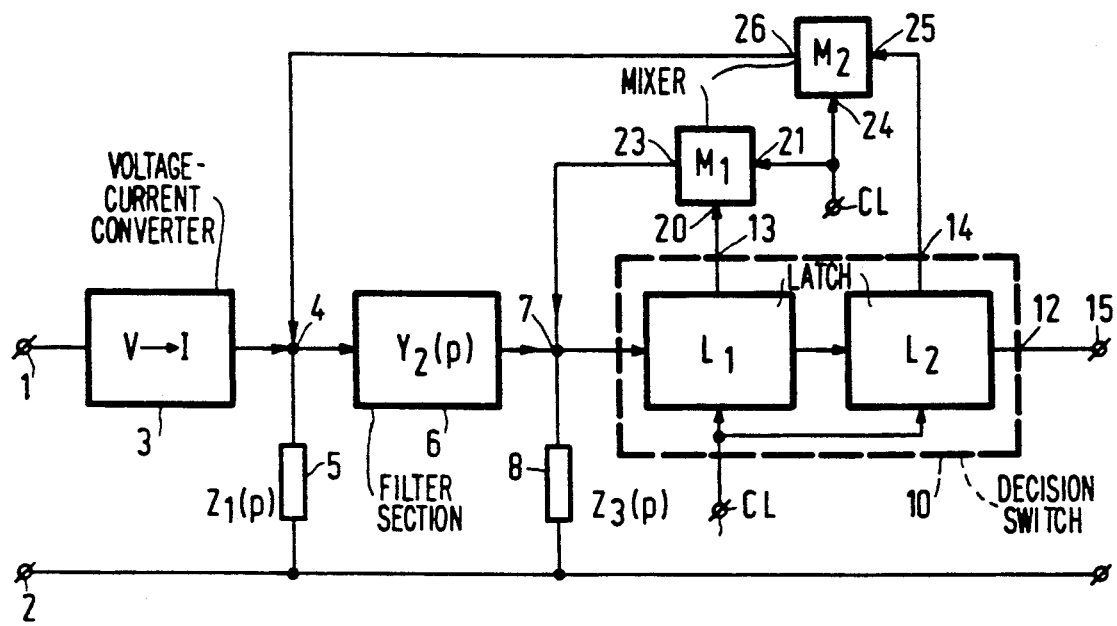
FIG. 3 shows a second block diagram of a sigma-delta modulator according to the invention.

FIG. 3 shows a block diagram of a second embodiment of a 1-bit SDM according to the invention. Components having like reference numerals in FIG. 3 correspond to those shown in FIG. 1. The decision switch 10 is now arranged as a cascade connection of a first latch L1 whose input is connected to summation point 7, and a second latch L2 whose input is connected to the output of the first latch L1. The two latches are clocked with the same clock signal at the control input 11 of the decision switch 10. During a first phase of the clock signal CL, for example, when the clock signal is high, the latches amplify the difference between the signal at their inputs and a reference. During a second phase of the clock signal CL, for example, when the clock signal is low, the amplified signal is regeneratively amplified and latched. Due to the finite gain of the latches at very high frequencies, the latched signal of the first latch L1 is still rather inaccurate, but that of the second latch L2 is sufficiently accurate due to the increased gain and the longer decision time. However, the main point of the latched signal of the second latch L2 has an overall delay of ¾ clock period relative to the decision instant occurring in the first latch L1 a half clock period earlier. This delay is undesired for high frequencies because this is at the cost of the high-frequency phase margin which is very narrow as it is. According to the invention the output signal of the first latch L1 is used as a first feedback signal for output 13 and the output signal of the second latch L2 is used as a second feedback signal for output 14 of the decision switch 10. The first feedback signal at output 13 is relatively inaccurate it is true, but this is of minor importance in the first feedback loop. It is certainly important for the delay in the first loop to be minimal with high frequencies so that the phase margin is maintained. The additional delay in the output signal of the second latch L2 is of minor importance in the second loop because in this loop the phase shift of the active loop filter is dominant. The much larger gain and reliability of the output signal of the second latch L2 does add to the overall loop gain in the second loop and enhances the accuracy with which the baseband B of the input signal is approached in the digital output signal.

Figure 4:
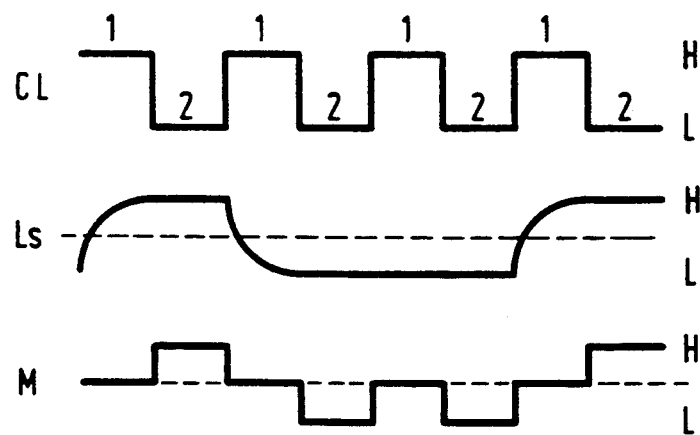
FIG. 4 shows the signal waveforms in a mixer stage of the block diagram shown in FIG. 3.

With high clock rates the output signals at outputs 13 and 14 are sub-ideal. During the first phase of the clock signal CL, referenced 1 in FIG. 4, the output signals of the latches, referenced Ls in FIG. 4, do not change abruptly from one extreme value L to the other extreme value H, but according to a certain curve determined by the latch rate. The signal shape of signal Ls changes with the input signal and causes an undesired component in the first and second feedback loops which reduces the accuracy of the SDM. In order to render the signal shape of the output signals at outputs 13 and 14 of the latches L1 and L2 independent of what occurs during the first phase of the clock pulse CL, these signals are applied to inputs 20 and 25 of mixer stages M1 and M2, respectively. The mixer stages further have an output 23, 26, respectively, and a control input 21, 24, respectively, to which the clock signal CL is applied. The mixer stage produces an output signal referenced M in FIG. 4 in which, during the first phase of the clock signal CL, the instantaneous value of the input signal is replaced with a fixed value and which follows the input signal during the second phase of the clock signal CL. Either of the two mixer stages M1 and M2 can be omitted as desired or as required.

Figure 5:
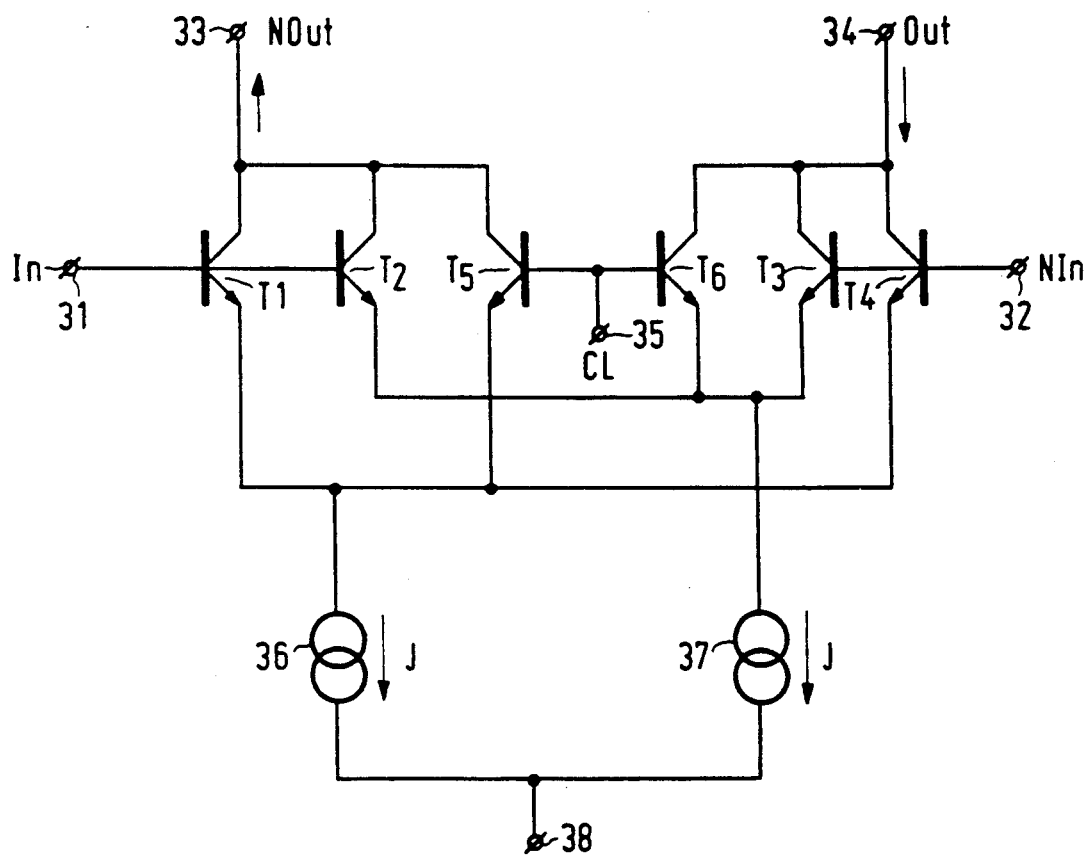
FIG. 5 shows a circuit diagram of a mixer stage in a sigma-delta modulator according to the invention.

FIG. 5 shows a circuit diagram of a mixer stage suitable for use at very high clock frequencies. The mixer stage has balanced inputs 31, 32 for connecting the latched signal originating from the latch L1 of L2. If the latches produce unbalanced signals, either of the inputs 31 and 32 is to be connected to a suitable reference voltage. The mixer stage also has balanced outputs 33, 34 either of which can remain unused if so desired by connecting it to a fixed supply voltage. The clock signal CL is connected to a clock input terminal 35. To input 31 are connected the bases of transistors T1 and T2 each of whose collectors are connected to output 33 and whose emitters are connected to a first current source 36 and a second current source 37, respectively. To the other input 32 are connected the bases of transistors T3 and T4 each of whose two collectors are connected to output 34 and whose two emitters are connected to the second current source 37 and the first current source 36, respectively. Both current sources produce a current J. The collector-emitter paths of transistors T5 and T6, whose bases are connected to clock input terminal 35, are connected in parallel to collector-emitter paths of the transistors T1 and T3, respectively.

During the second phase of the clock signal CL the voltage at terminal 35 is low and the transistors T5 and T6 are blocking. If during that phase the voltage at terminal 31 is high and at terminal 32 low, the transistors T1 and T2 will be conductive and transistors T3 and T4 will be blocking. The current of current source 36 flows through transistor T1 and the current of current source 37 flows through transistor T2 to output terminal 33 in which a current 2J flows. There is no current flowing through output terminal 34 and, consequently, the value is 0. If, on the other hand, the voltage at terminal 31 is low and at terminal 32 high, the current through terminal 33 will be 0 (zero) and through terminal 34 2J.

During the first phase of the clock signal CL the voltage at terminal 35 is high and the transistors T5 and T6 are conductive so that there is a continuous connection between terminal 33 and current source 36, on the one hand, and terminal 34 and current source 37, on the other. A current J now flows through both terminal 33 and terminal 34 irrespective of the voltages at the terminals 31 and 32.

So, the mixer stage produces at the outputs 33, 34 currents having a fixed value J during the first phase of the clock signal and a value 0J or 2J, depending on the sign of the voltage difference across the terminals 31, 32, during the second phase of the clock signal.

The circuit shown in FIG. 5 is structured in bipolar NPN-transistors. Bipolar PNP-transistors or unipolar N-channel and P-channel transistors can also be used. This similarly applies to the circuit shown in FIG. 6 to be discussed hereinafter.

Figure 6:
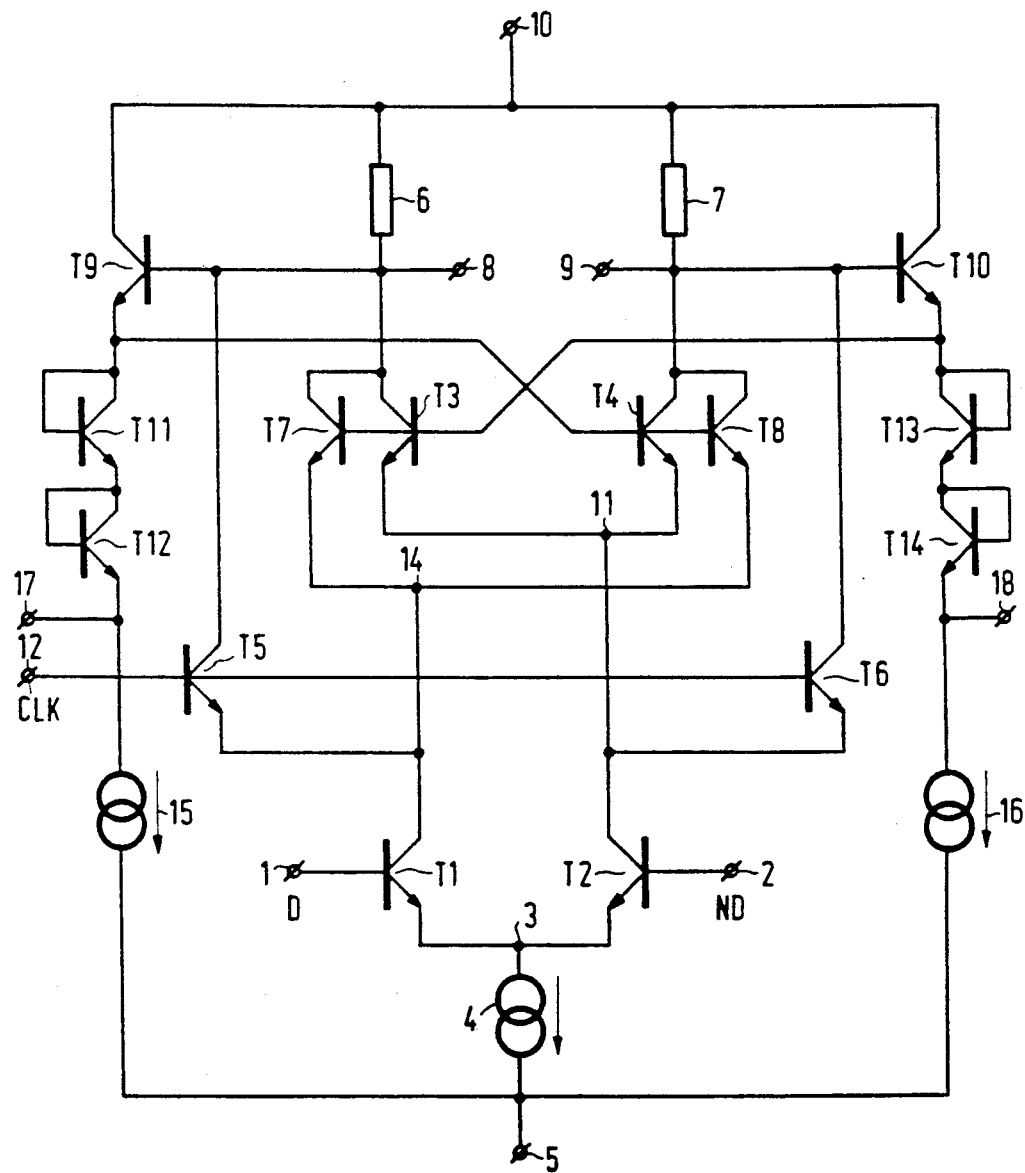
FIG. 6 shows a circuit diagram of a latch that can suitably be used in a sigma-delta modulator according to the invention.

FIG. 6 shows a suitable latch to be used as latch L1 and L2 in the SDM as shown in FIG. 3. As in the mixer stage shown in FIG. 5 the latch has balanced inputs, one input of which may be connected to a suitable fixed voltage as desired.

The signal to be latched is connected to terminals 1 and 2 which are connected to the bases of the respective transistors T1, T2 arranged as a differential amplifier, whose emitters are connected to a negative supply terminal 5 by means of a bias current source 4. The collectors of the transistors T1 and T2 are connected to the respective load resistors 6 and 7 and terminals 8 and 9 by means of the collector-emitter paths of the respective transistors T5 and T6. The other ends of the resistors 6 and 7 are connected to a positive supply terminal 10. The bases of the transistors T5 and T6 are connected to a clock signal input 12 to which the clock signal CL is applied. By means of the base emitter junction of a transistor T9 arranged as a buffer, terminal 8 is connected to the bases of transistors T4 and T8 whose collectors are connected to terminal 9 and whose emitters are connected to the collectors of the respective transistors T2 and T1 at respective junctions 11 and 14. By means of the base emitter junction of a buffered transistor T10, terminal 9 is connected to the bases of the transistors T3 and T7 whose collectors are connected to terminal 8 and whose emitters are connected to the respective junctions 11 and 14. The emitters of the buffer transistors T9 and T10 are furthermore connected to supply terminal 5 by means of two transistors T11, T12 and T13, T14, respectively, arranged as diodes and a bias current source 15, 16, respectively. The terminals 17 and 18 of the respective current sources 15 and 16 and the diodes T11, T12 and T13, T14 are connected to output terminals 17 and 18 respectively, at which complementary buffered output signals are available that may be fed to the inputs 1, 2 of the same latch or to the inputs 31, 32 of a mixer stage as shown in FIG. 5.

If the clock signal CL at terminal 12 is "high", the transistors T5 and T6 will conduct so that the resistors 6 and 7 will be connected to the collectors of transistors T1 and T2. The voltage difference across the terminals 1, 2 appears in amplified form across the terminals 8 and 9. If the clock signal CL is "low", the transistors T5 and T6 will cut-off and the voltage difference at the terminals 8 and 9 will be regeneratively amplified and latched by means of the transistors T3, T4, T7 and T8 arranged as flip-flops. The flip-flop will then receive a bias current from the current source 4 through the transistors T1 and T2.

Figure 7:
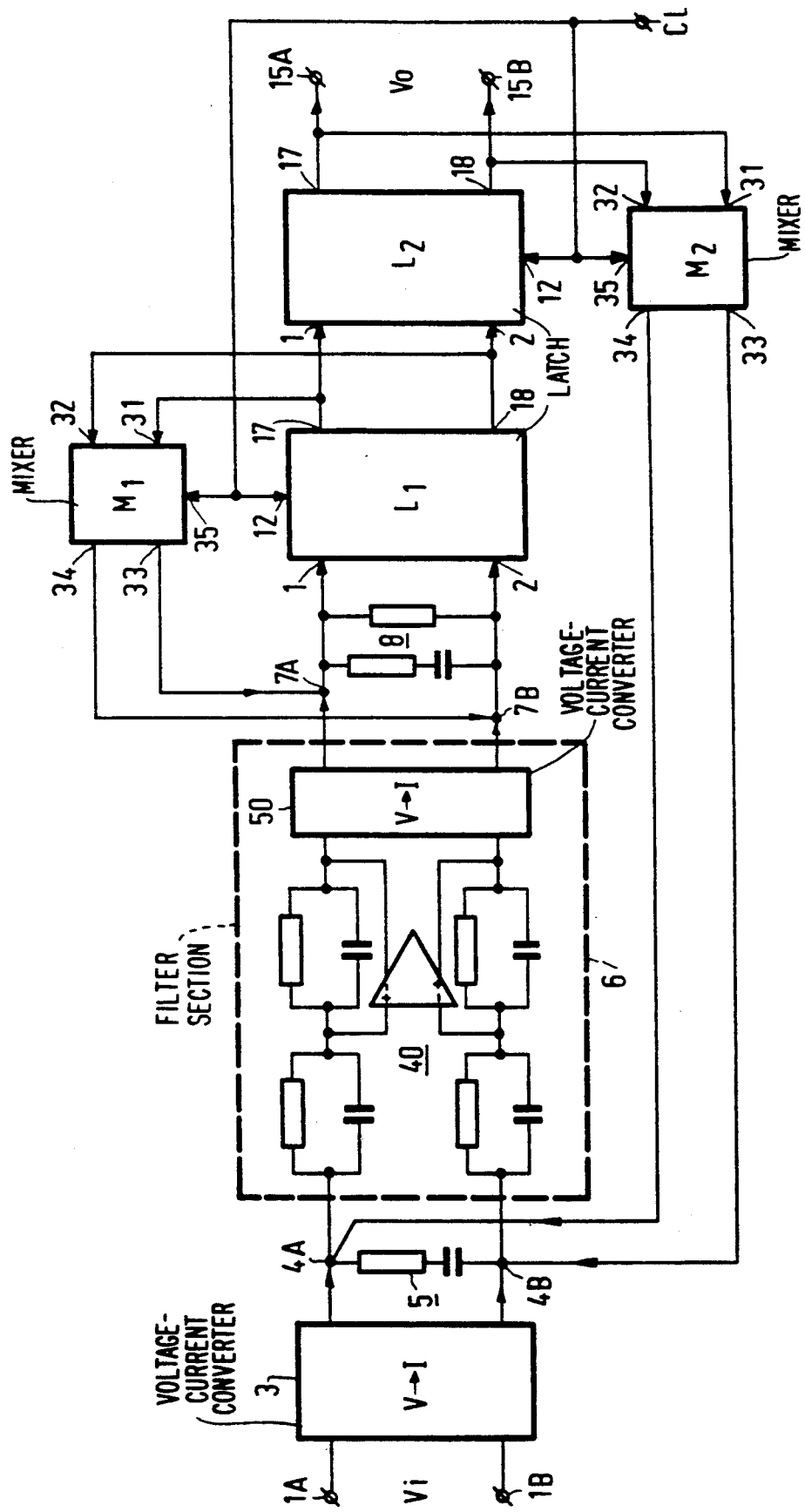
FIG. 7 shows a circuit diagram of an embodiment of a sigma-delta modulator according to the invention.

FIG. 7 shows a possible embodiment of a SDM according to the invention which operates with balanced signals. The SDM is arranged in accordance with the block diagram shown in FIG. 3. The input signal is fed to the input terminals 1A and 1B of a voltage-to-current converter 3 which delivers balanced output currents to current summation points 4A and 4B. A passive impedance 5 consisting of a series connection of a resistor and a capacitor is arranged across the points 4A and 4B. Alternatively, it is possible to connect each of the points 4A and 4B to a common signal ground point across a similar impedance 5. Furthermore, the inputs of an active first order filter section 6 that comprises a balanced active integrator 40 followed by a balanced voltage-to-current converter 50 delivering currents to current summation points 7A and 7B are connected to points 4A and 4B. A passive impedance 8 consisting of a parallel connection of a resistor and a series connection of a resistor and a capacitor is connected to the points 7A and 7B. Also in this case it is possible to connect each of the points 7A and 7B to a common signal ground point by means of a similar impedance 8. To the points 7A and 7B are furthermore connected the inputs 1, 2 of a first latch L1 of the type represented in FIG. 6. The outputs 17, 18 of latch L1 are connected to the inputs 31, 32 of a mixer stage M1 of the type represented in FIG. 5 and also to the inputs 1, 2 of a second latch L2 which is identical with latch L1. The outputs of latch L2 are connected to the inputs 31, 32 of a mixer stage M2 identical with the mixer stage M1 and, furthermore, to the output terminals 15A and 15B of the SDM. The outputs 33, 34 of the mixer stage M1 are connected in a negative feedback arrangement to the summation points 7A and 7B and the outputs 33 and 34 of mixer stage M2 are connected in like manner to the summation points 4A, 4B. A clock signal CL is fed to the appropriate inputs 12 of the latches L1 and L2 and 35 of the mixer stages M1 and M2.

The relatively small phase shift in the first loop provides the possibility of optimising the second passive impedance for high frequencies, for example, by connecting a capacitor in parallel to the resistor which is connected in series to the capacitor. This results in a fourth order loop filter. The stability of the system permitting, a similar modification may also be effected in the passive first and/or active second filter section.

We claim:

1. Sigma-delta modulator for converting an input signal into a 1-bit digital output signal, comprising:
    a low-pass filter including a series connection of first, second and third sections having at least first order filter functions, each section having an input and having an output for producing respective first, second and third section signals; quantization means for converting the third section signal into the 1-bit digital output signal and for producing first and second feedback signals in response to the digital output signal;
    a first subtractor stage for producing a first difference signal from the second section signal and the first feedback signal and for applying the first difference signal to the input of the third filter section;
    a second subtractor stage for producing a second difference signal form the input signal and the second feedback signal and for applying the second difference signal to the input of the first filter section; and
    coupling means for coupling the first section signal to the input of the second filter section,
characterized in that the first and third filter sections as regards the signal frequencies are arranged as passive networks, and in that the second filter section is arranged as an active filter stage.

2. Sigma-delta modulator as claimed in claim 1, characterized in that the quantization means comprise:
    a first latch for measuring the third section signal during a first phase of a clock signal and for producing a first latched signal during a second phase of the clock signal; and
    a second latch for measuring the first latched signal during the first phase of the clock signal and for producing a second latched signal during the second phase of the clock signal, the first and second latched signals functioning as the first and second feedback signals, respectively.

3. Sigma-delta modulator as claimed in claim 2, characerized in that the modulator further includes at least one mixer stage for replacing, during an first phase of the clock signal, the instantaneous value of one of the first and second latched signals with a fixed signal value that is independent of said instantaneous value.

4. Sigma-delta modulator as claimed in claim 3, characterized in that the mixer stage comprises
    first to sixth transistors each comprising a first and a second main electrode and a control electrode;
    first and second input terminals for receiving the latched signal and a signal complementary thereto, respectively;
    a third input terminal for receiving the clock signal;
    a first and second output terminal for delivering the feedback signal and a feedback signal complementary thereto;
    first and second current sources; and
    coupling means for coupling:
    the control electrodes of the first and second transistors to the first input terminal;
    the control electrodes of the third and fourth transistors to the second input terminal;
    the first main electrodes of the first, fourth and fifth transistors to the first current source;
    the first main electrodes of the second, third and sixth transistors to the second current source;
    the second main electrodes of the third, fourth and sixth transistors to the second output terminal; and
    the second main electrodes of the third, fourth and sixth transistors to the second output terminal; and
    the control electrodes of the fifth and sixth transistors to the third input terminal.

* * * * *

UNITED STATES PATENT AND TRADEMARK OFFICE
CERTIFICATE OF CORRECTION

Page 1 of 2

PATENT NO. : 5,103,228
DATED : April 7, 1992
INVENTOR(S) : Johannes O. Voorman, et. al.

It is certified that error appears in the above-indentified patent and that said Letters Patent is hereby corrected as shown below:

Column 5, line 20, change "1" (after the equation) to
    --(1)--;
    after line 25, change "2" (after the equation) to
    --(2)--;
Column 7, line 12, delete "two";
    line 13, delete "two";
    line 18, after "to" insert --the--;
    line 44, change "2I" to --2J--.

Claim 1, column 9, line 30, change "form" to --from--.

Claim 3, column 10, line 11, change "an" to --the--;
    line 12, change "the" (second occurrence) to --an--.

Claim 4, column 10, lines 37 and 38 delete in their entirety and substitute --the second main electrodes of the first, second and fifth

UNITED STATES PATENT AND TRADEMARK OFFICE
CERTIFICATE OF CORRECTION

PATENT NO. : 5,103,228
DATED : April 7, 1992
INVENTOR(S) : Johannes O. Voorman, et. al.

It is certified that error appears in the above-indentified patent and that said Letters Patent is hereby corrected as shown below:

transistors to the first output terminal;--.

Signed and Sealed this

Twenty-second Day of February, 1994

Attest:

BRUCE LEHMAN

*Attesting Officer*         *Commissioner of Patents and Trademarks*